United States Patent [19]

Trumpp

[11] Patent Number: 4,775,808
[45] Date of Patent: Oct. 4, 1988

[54] CIRCUIT ARRANGEMENT FOR DRIVING AN IC MODULE WITH DIGITAL SIGNALS

[75] Inventor: Gerhard Trumpp, Puchheim, Fed. Rep. of Germany

[73] Assignee: Siemens Aktiengesellschaft, Berlin and Munich, Fed. Rep. of Germany

[21] Appl. No.: 25,390

[22] Filed: Mar. 13, 1987

[30] Foreign Application Priority Data

Mar. 14, 1986 [DE] Fed. Rep. of Germany ....... 3608616

[51] Int. Cl.⁴ ..................... H03K 17/16; H03K 17/56; H03K 5/153
[52] U.S. Cl. ................................... 307/443; 307/242; 307/354; 307/359; 307/362
[58] Field of Search ............... 307/579, 242, 359, 360, 307/354–356, 362, 443, 475

[56] References Cited

U.S. PATENT DOCUMENTS

| | | | |
|---|---|---|---|
| 3,537,025 | 10/1970 | Baum et al. | 330/103 |
| 3,573,492 | 4/1971 | Lake et al. | 307/362 |
| 4,097,860 | 6/1978 | Araseki et al. | 307/359 |
| 4,242,604 | 12/1980 | Smith | 307/251 |
| 4,263,555 | 4/1981 | Hunka | 328/165 |
| 4,678,935 | 7/1987 | Nawata et al. | 307/443 |
| 4,888,064 | 12/1984 | Vance | 307/297 |

FOREIGN PATENT DOCUMENTS

| | | |
|---|---|---|
| 2324692 | 11/1974 | Fed. Rep. of Germany . |
| 3346725 | 7/1985 | Fed. Rep. of Germany . |
| 57-115047 | 1/1984 | Japan . |
| 59-5740 | 1/1984 | Japan . |

OTHER PUBLICATIONS

Puchow, L. N., "Miniatur-Zeit-und Impulswandler", M. Energija, 1979, p. 8 (FIG. 1).

Primary Examiner—John S. Heyman
Assistant Examiner—M. R. Wambach
Attorney, Agent, or Firm—Hill, Van Santen, Steadman & Simpson

[57] ABSTRACT

For driving an IC module with output digital signals of another IC module, mutually-identical input circuits are provided for the individual digital signals, the respective switching thresholds of the input circuits, controlled by a control circuit shared by the input circuits, being set based on the DC component appearing in a digital signal representative of the remaining digital signals. Positional changes of the digital signals are therefore compensated by positional changes of the switching thresholds.

6 Claims, 2 Drawing Sheets

CIRCUIT ARRANGEMENT FOR DRIVING AN IC MODULE WITH DIGITAL SIGNALS

BACKGROUND OF THE INVENTION

1. Field of the Invention

The present invention relates to a circuit arrangement for driving an IC module by output digital signals of another IC module, and is particularly concerned with such a circuit arrangement in which mutually identical input circuits are provided for the individual data signals, the respective switching threshold of the input circuits being set based on the measure of the DC component appearing in a representative digital signal, being controlled by a control signal shared by the input circuits and comprising a limiter charged by a digital signal whose signal level is also representative for the remaining digital signals and comprising a low-pass filter following the limiter and leading to the control inputs of the input circuits.

2. Description of the Prior Art

Various circuit technologies have been developed with respect to integrated digital circuits which respectively do justice to a particular degree to specific requirements to be made of integrated circuits, but thereby are usually burdened with other, disadvantageous properties. Therefore, the emitter coupled logic (ECL) technology which has long been utilized is particularly distinguished by the speed and the response sesitivity of its circuits, this, however, involving relatively high stray energy and a low protection against malfunction. Resulting therefrom is that ECL technology can hardly be replaced at present in certain applications, for instance in line drivers and line receivers, but that there is a simultaneous tendency to at least realize other circuit portions with large scale integrated (LSI) digital circuits of other technologies, for example in complementary-metal-oxide-semiconductor (CMOS) technology, which, on the one hand, can also be adequately fast and wherein, on the other hand, the power consumption is far lower. However, it is then not yet adequate to merely provide fast input circuits, for example CMOS inverters, at the interfaces between ECL technology and CMOS technology. On the contrary, such fast CMOS input circuits must also be supplied with the correct digital signal level. This can be effected by an appropriate level balancing in an interface circuit, whereby, however, a simple level matching is frequently inadequate in practice, but level fluctuations, do, for example, to feed voltage fluctuations and temperature changes, must also be avoided.

SUMMARY OF THE INVENTION

In view of the foregoing, the object of the present invention is to enable a drive of fast input circuits of an IC module of one technology proceeding from an IC module of another technology without respectively requiring a level matching and a suppression of voltage and temperature change influences on the digital signal level.

The present invention is directed to a circuit arrangement for driving an IC module by output digital signals of another IC module. This circuit arrangement, according to the present invention, is particularly characterized in that mutually-identical input circuits are provided for the individual digital signals, the respective switching thresholds of these input circuits being set based on the measure of the DC component occurring in the representative digital signal, being controlled by a control circuit shared by the input circuits and comprising a limiter charged by a digital signal whose signal level is also representative for the other digital signal and a low-pass filter following the limiter and leading to the control inputs of the input circuits.

Proceeding on the basis that the output digital signals of another IC module (or of a plurality of such IC modules) driving an IC module essentially coincide with one another in terms of their signal levels, so that one digital signal is therefore representative of the other digital signals in this regard, and proceeding on the basis of an adequately-constant pulse duty factor ("high" bit duration: "low" bit duration) and a ratio of bit period duration to edge transition time of this representative digital signal which lies within prescribed limits, the present invention produces the advantage, without having to know the signal curves (signal states, pulse duty factors, edge positions) of the other digital signals driving the IC module in detail, of nonetheless doing justice to the fluctuations of these digital signals from their reference curve (caused, for example, by feed voltage or temperature) by means of a corresponding follow-up of the operating points (switching threshold) of the input circuits of the IC module charged with these digital signals and to therefore be able to compensate their effects, whereby the respective shift of the switching threshold effects the desired compensation in combination with the finite edge steepness of the digital signal.

It should be noted in this context that it is known for an interface chip, for example a transistor-transistor-logic-metal-oxide-semiconductor (TTL-MOS) junction (from U.S. Pat. No. 4,242,604, fully incorporated herein by this reference) to provide a reference stage charged with a fixed reference voltage in addition to input stages charged with input signals for stabilizing the decision threshold in the face of chip temperature-caused changes of the input transistor threshold voltage, the output signal thereof in this reference stage, as well as in every input stage, respectively controlling a low end transistor so that the resistance thereof changes such that the source potential of the respective input transistor is modified in a direction opposite to its threshold voltage. Such a stabilization of the decision threshold in the face of temperature modifications of the chip itself, however, does not do justice to the potential deviations of the input signals in and of themselves from their reference curve; however, the present invention discloses a technique of doing this.

It should also be noted that it is known in the context of a scanning of graphics originals and conversion of the scan signal into a digital signal to provide a differentiation network and a following, high-gain comparator in the signal path for the purpose of a signal detection of small input signal pulses contained in the background signal which is independent of variations of a background signal and/or of an input signal amplitude and/or duration, the output of the comparator being connected to the second input of the first-mentioned differentiating network via a negative feedback path comprising a limiter, a mean value circuit and a further differentiating network having its second input connected to a reference voltage source (U.S. Pat. No. 4,263,555, fully incorporated herein by this reference). Other than that, there are no closer points of contact with respect to the present invention.

Turning again to the present invention, the input circuits according to a further feature of the invention can be formed with a switching transistor in gate circuitry inserted into the digital signal path and connected to a load transistor, the common control circuit leading to the gate electrode of this switching transistor. The limiter can be formed with an inverter circuit in accordance with a further feature of the invention. The low-pass filter circuit, which can be simply formed with an RC element, can be connected to the control inputs of the input circuits via a controlled-gain amplifier in accordance with a further feature of the invention, being preferably connected thereto via a differential amplifier charged with a reference signal at its second input.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
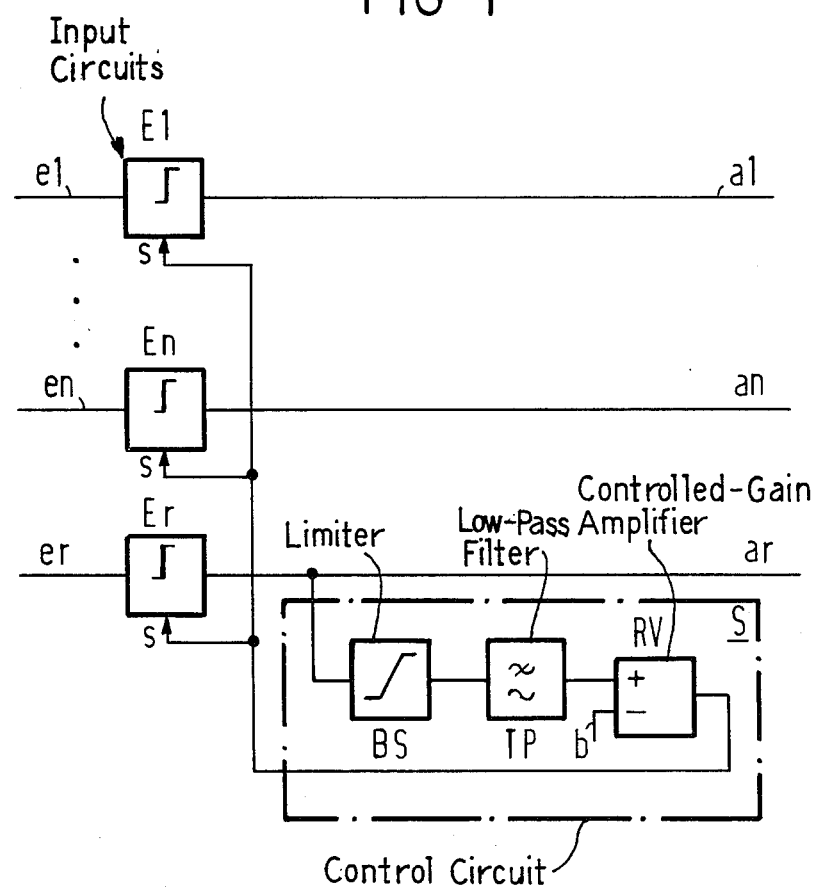
FIG. 1 is a schematic representation of an exemplary embodiment of a circuit arrangement constructed in accordance with the present invention.

The exemplary embodiment of a circuit arrangement for digital signal drive of an IC module, according to the present invention, is schematically shown in FIG. 1 as comprising mutually-identical input circuits El, ... En, Er for the individual digital signals driving the IC module at a plurality of input lines el-al, ..., en-an, er-ar, the switching thresholds of these input circuits being respectively adjustable via control inputs s. The control circuit S is constructed with a limiter BS and a low-pass filter TP. The low-pass filter TP leads to the control inputs s of the input circuits El, ... En, Er via a control-gain amplifier RV, via a differential amplifier charged with a reference signal b at its second input in the present example. At its input, the control circuit S is connected to one of the input circuits E, the input circuit Er in the present example, whereby it has been assumed that the digital signal appearing at the circuit input er is also representative for the digital signals appearing at the remaining signal inputs el ... en in terms of its signal level and in terms of its dislocations caused, for example, due to feed voltage or temperature changes. Based on the measure of the DC component appearing in this representative digital signal, the control signal S sets the respective switching threshold in the input circuits El ... En, Er which it controls.

In the reference condition of the circuit, it is assumed that the representative digital signal exhibit a defined pulse duty factor, i.e. a defined relationship of the duration of a "high" bit to the duration of a "low" bit on the basis whereof the digital signal, limited in the limiter BS, comprises a defined DC component which is filtered out by the low-pass filter TP. Given a pulse duty factor 1:1, this DC component can also be of the magnitude zero. In the controlled-gain amplifier RV, the output signal of the low-pass filter TP is placed in relationship with the reference signal of b determined based on the measure of the pulse duty factor of the representative digital signal and the properties of the limiter BS, so that the control signal appearing at the output of the controlled-gain amplifier RV and, therefore, at the control inputs s of the input circuits El ... En, Er sets the respective switching threshold in the input circuits exactly to a level corresponding to the signal level reference value.

When the position of the representative digital signal changes, for example due to a change of a supply voltage in the system, then, when traversing the response threshold in the input circuit Er, the finite edge steepness thereof leads to the fact that, given a level increase, the "high" duration is lengthened and the "low" bit duration is shortened or that, respectively, inversely, given a level decrease, the "high" bit duration is shortened and the "low" bit duration is lengthened. This causes a corresponding change in the output signal of the low-pass filter TP and, therefore, in the control signal supplied to the control inputs s of the input circuits El ... En, Er via the control-gain amplifier RV, with the result that the respective switching threshold is correspondingly increased or, respectively, decreased, so that the positional change of the digital signal is compensated by the positional change of the switching threshold.

Figure 2:
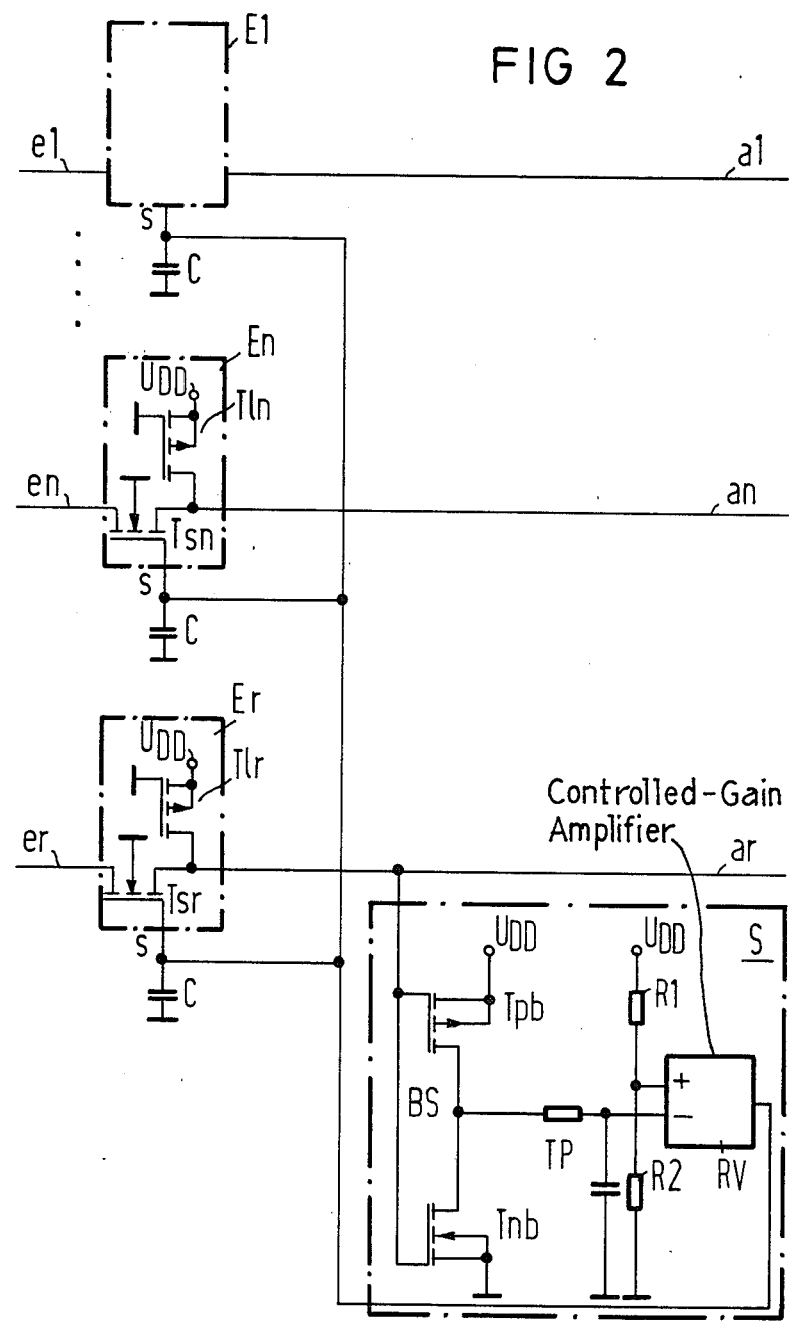
FIG. 2 is a schematic circuit diagram of the exemplary embodiment of FIG. 1 illustrating its particular circuit details.

The realization of the input circuits E and the control circuit S is illustrated in FIG. 2. In the exemplary embodiment of the circuit arrangement constructed in accordance with the present invention as shown in FIG. 2, the input circuits E and the limiter BS are realized in CMOS technology. In accordance with FIG. 2, the input circuits El ... En are each formed with a switching transistor Tsn in gate circuitry inserted into the respective signal path (such as the signal path en-an), the common control circuit S leading to the gate electrode thereof and the output side of this switching transistor connected to a field voltage source $U_{DD}$ (for example, $+U_{DD}$) via a respective load transistor Tln. In the exemplary embodiment, the switching transistor Tsn is thereby an n-channel enhancement field effect transistor and the load transistor Tln, forming a current source together with the feed voltage source $U_{DD}$, is thereby a p-channel enhancement field effect transistor. In a corresponding manner, the threshold circuit Er is formed with a switching transistor Tsr in gate circuitry inserted into the digital signal path er-ar traversed by the representative data signal, the control circuit S leading to the gate electrode thereof and the output side of this switching transistor connected to the feed voltage source $U_{DD}$ via a load transistor Tlr.

The limiter BS is formed with a CMOS inverter comprising two transistors Tpb, Tnb. As further illustrated in FIG. 2, the low-pass filter TP can be formed with a simple RC element. In the exemplary embodiment of FIG. 2, the low-pass filter TP is followed by a control-gain amplifier in the form of a differential amplifier RV, whereby the digital signal inversion effected in the limiter BS is taken into consideration by connection to the inverting input (−) of the differential amplifier RV. At its non-inverting input (+), the differential amplifier RV, in the exemplary embodiment of FIG. 2, is supplied with a reference voltage which is acquired from the feed voltage $U_{DD}$ by way of a voltage divider comprising a resistor R1 and a resistor R2 and is dimensioned based on the measure of the pulse duty factor of the representative digital signal established in the reference condition of the system.

In the circuit arrangement of FIG. 2, it is assumed that a potential of, for example, about $-1$ V prevails at the individual signal path inputs el . . . en, er in the respective digital signal state "High" and a potential of about $-2$ V prevails at the digital signal state "Low". The digital signals can thereby be coded, for example, in a DC-free code, whereby the two potential states should then statistically occur for equal durations, i.e. as seen over an adequately-long time. It is assumed that a control potential, for example, of about $+0.4$ V is applied at the control inputs s of the input circuits El . . . En, Er and, therefore, at the gate electrode of the respective switching transistor Tsn, Tsr of the input circuits proceeding from the control circuit S, whereby the switching threshold of the switching transistor Ts connected to the load transistor T1 may thereby be assumed to lie therebelow by a threshold voltage of, for example, about $-1.8$ V.

Given the signal state "High" prevailing at the input er, the switching transistor Tsr in the input circuit Er is then nonconductive and a potential of about $+3.3$ V in the present example then arises at the input of the limiter BS whose switching threshold may be assumed to lie at about $+1$ V, the p-channel transistor Tpb of the CMOS inverter being nonconductive as a result thereof (or being at most weakly conductive) and the n-channel transistor Tnb being (highly) conductive. In the digital signal state "Low", the switching transistor Tsr in the input circuit Er is conductive and a potential of about $-1.2$ V in the present example arises at the input of the limiter circuit BS, the p-channel transistor Tpb of the CMOS inverter being conductive on the basis thereof and the n-channel transistor Tnb being nonconductive. By way of the low-pass filter TP the chronological mean value of the digital signal appearing at the limiter output proceeds to the one input $(-)$ of the differential amplifier RV whose other input $(+)$ is charged with the reference signal and from whose output the control potential of $+0.4$ V in the present example can be assumed to be output given a pulse duty factor 1:1 observed by the digital signal (in the example of a DC-free code).

When the pulse duty factor of the digital signal appearing at the signal input er, which is representative of the remaining digital signals, departs from the relationship 1:1 (in the example of a DC-free coding), i.e. when the signal state "High" appears for a longer (or, respectively, shorter) time at the signal path input er than the signal state "Low", as seen over an adequately-long time, and, consequently, the signal state "Low" appears for a longer (or, respectively, shorter) time at the limiter output than the signal state "High", than a corresponding lowering (or, respectively, increasing) in the output signal of the low-pass filter TP and, therefore, a corresponding increase (or, respectively, decrease) of the input signal difference at the differential amplifier RV arises. This causes a corresponding increase (or, respectively, decrease) in the potential supplied from the output of the differential amplifier RV to the control input s of the input circuits El . . . En, Er by an amount of, for example, 0.2 V with the result that, accordingly, the switching threshold of the CMOS input circuits is increased (or, respectively, decreased). The positional change of the respective digital signal is compensated by the positional change of the respective switching threshold.

In conclusion, it should also be pointed out that the individual control inputs s, in the circuit arrangement of FIG. 2 can also be blocked off by capacitors C in order to avoid coupling between the individual signal paths el-al . . . en-an, er, ar.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A circuit arrangement for driving an integrated circuit module by output data signals of another integrated ciruict module, comprising:
    a plurality of identical input circuits for receiving the output data signals, each of said input circuits including an input for receiving a respective output data signal, a control input, and an output, each of said input circuits including a switching threshold; and
    a control circuit including a limiter connected to said output of one of said input circuits and charged by the output data signal, said limiter including an output, a low-pass filter connected to said output of said limiter, and an output circuit connected to said low pass filter and connected to said control inputs of said input circuits for setting the switching thresholds for all of said input circuits based on a D.C. component appearing in said output digital signal of said one of said input circuits.
2. A circuit arrangement of claim 1, wherein:
    one of said input circuits is constructed with a switching transistor connected in common-gate configuration and which includes a signal path connected in series in a digital signal path extending between said input and said output of said one input circuit; and
    a load element is connected to said switching transistor,
    said output of said control circuit is connected to said gate electrode of said switching transistor.
3. The circuit arrangement of claim 1, wherein: said limiter comprises an inverter.
4. The circuit arrangement of claim 1, wherein: said low-pass filter comprises a resistor-capacitor combination.
5. The circuit arrangement of claim 1, wherein: said output circuit comprises a controlled-gain amplifier including a first input connected to said low-pass filter and a second input connected to a reference potential, the output of said controlled-gain amplifier representing the potential difference between the potentials appears at said first and second inputs.
6. The circuit arrangement of claim 5, wherein: said controlled-gain amplifier is a differential amplifier.

* * * * *

UNITED STATES PATENT AND TRADEMARK OFFICE
CERTIFICATE OF CORRECTION

PATENT NO. : 4,775,808
DATED : October 4, 1988
INVENTOR(S) : Gerhard Trumpp

It is certified that error appears in the above—identified patent and that said Letters Patent is hereby corrected as shown below:

On the cover sheet, first column, last line 4,888,064 should read --4,488,064--.

Signed and Sealed this

Sixth Day of March, 1990

Attest:

JEFFREY M. SAMUELS

Attesting Officer

Acting Commissioner of Patents and Trademarks